United States Patent
Backhaus

(10) Patent No.: US 8,344,270 B2
(45) Date of Patent: Jan. 1, 2013

(54) COMBINATION OF A MAIN CARRIER AND A PRINTED CIRCUIT BOARD WITH COMPONENTS

(75) Inventor: Klaus Backhaus, Fürth (DE)

(73) Assignee: Semikron Elektronik GmbH & Co., KG, Nürnberg (DE)

( * ) Notice: Subject to any disclaimer, the term of this patent is extended or adjusted under 35 U.S.C. 154(b) by 448 days.

(21) Appl. No.: 12/466,976

(22) Filed: May 15, 2009

(65) Prior Publication Data
US 2009/0284936 A1  Nov. 19, 2009

(30) Foreign Application Priority Data
May 15, 2008  (DE) .......................... 10 2008 023 714

(51) Int. Cl.
*H05K 1/00* (2006.01)
(52) U.S. Cl. ........ 174/544; 174/520; 174/535; 361/748; 361/752
(58) Field of Classification Search .......... 361/748, 361/707, 714, 719, 730, 734, 736, 743, 745, 361/749, 752, 760, 761, 796, 803, 807, 830, 361/679.34, 809, 679.01; 174/42, 544, 535, 174/50, 520; 439/620.24, 2, 383–385, 406, 439/86; 505/191, 257
See application file for complete search history.

(56) References Cited

U.S. PATENT DOCUMENTS

| | | | | | |
|---|---|---|---|---|---|
| 5,373,418 | A | * | 12/1994 | Hayasi | 361/707 |
| 5,699,235 | A | * | 12/1997 | Tsurumiya et al. | 361/803 |
| 5,777,851 | A | * | 7/1998 | Yamamoto | 361/748 |
| 5,943,214 | A | * | 8/1999 | Sato et al. | 361/752 |
| 6,297,981 | B1 | * | 10/2001 | Berberich et al. | 363/144 |
| 6,697,262 | B2 | * | 2/2004 | Adams et al. | 361/785 |
| 6,839,214 | B2 | * | 1/2005 | Berberich | 361/112 |
| 6,948,944 | B2 | * | 9/2005 | Ueno | 439/68 |
| 7,208,833 | B2 | * | 4/2007 | Nobori et al. | 257/704 |
| 7,800,222 | B2 | * | 9/2010 | Schulz et al. | 257/723 |
| 2001/0015887 | A1 | * | 8/2001 | Sanada et al. | 361/704 |

FOREIGN PATENT DOCUMENTS

| | | |
|---|---|---|
| DE | 42 25 358 | 2/1994 |
| DE | 43 00 899 | 7/1994 |
| DE | 43 25 499 | 2/1995 |
| DE | 198 50 153 | 5/2000 |

\* cited by examiner

*Primary Examiner* — Angel R Estrada
*Assistant Examiner* — Dimary Lopez
(74) *Attorney, Agent, or Firm* — The Law Offices of Roger S. Thompson

(57) ABSTRACT

A combination of a main carrier and a printed circuit board. Light and heavy electrical and/or electronic components are fixed on the printed circuit board, wherein at least one heavy component is mechanically fixedly connected to the main carrier and electrically conductively connected to conductor tracks of a first section of the printed circuit board. The first section of the printed circuit board is electrically conductively connected to a second section of the printed circuit board and decoupled from the second section of the printed circuit board with regard to mechanical vibrations by means of a decoupling device. The decoupling device may be, for example, a flexible section or a recess formed in said printed circuit board.

12 Claims, 3 Drawing Sheets

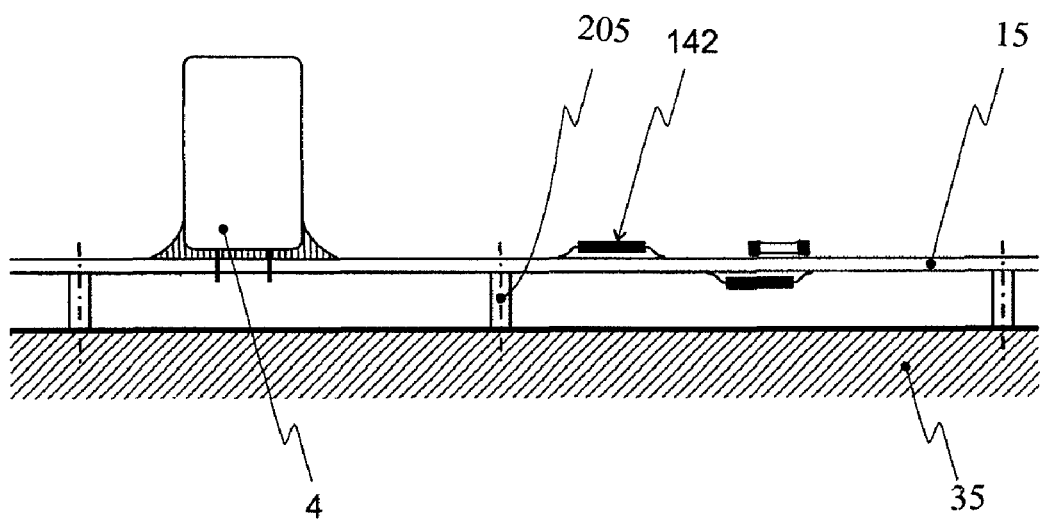
Fig. 5 *(Prior art)*

US 8,344,270 B2

COMBINATION OF A MAIN CARRIER AND A PRINTED CIRCUIT BOARD WITH COMPONENTS

BACKGROUND OF THE INVENTION

1. Field of the Invention

The invention is directed to a combination of a main carrier and a printed circuit board populated with electrical and electronic components and, more particularly, to such combinations as may be used in applications deployed in a mechanically demanding environment, such as in a vehicle.

2. Description of the Related Art

Combinations of main carriers and printed circuit boards are used in many kinds of electronic systems. If combinations of this type are used, for example, in vehicles with electrical main or auxiliary drives, the harshness of the environment demands that the combination be mechanically robust. Especially if structures of this type are populated with components having very different masses, meeting the demands for robustness with respect to vibrations is difficult according to commonly used prior art combinations.

Here and hereinafter "light" electrical or electronic components should be understood to mean by way of example: individual CMOS transistors, resistors that can be loaded with up to one watt and further components having a comparable mass. "Heavy" electrical or electronic components should be understood to mean components having at least a hundred times the mass of the light components. They are, by way of example capacitors, transformers or power semiconductor modules.

FIG. 5 illustrates a combination in accordance with the prior art. Here the illustration shows a printed circuit board 15 rigidly connected to a main carrier 35 by means of suitable connecting devices 205 such as screw connections guided in sleeves, by way of example. Main carrier 35 is embodied, for example, as a housing composed of die-cast aluminum, as is particularly suitable for the combination of different circuit combinations in vehicles. In this case, the housing has a significantly higher mass in comparison with the printed circuit board with the components 4, 142 that are arranged thereon and connected as appropriate for the requirements of the application. Main carrier 35, here the housing itself, is preferably connected directly and rigidly to the vehicle (not shown), by way of example.

As a result of the influence of vibrations that can occur with different amplitudes and frequencies both parallel and perpendicular to the plane of printed circuit board 15, primarily the fixings, generally soldered connections, of the heavy components 4 are loaded. A capacitor is illustrated here as an example of a heavy component, the capacitor being connected to printed circuit board 35, or the conductor tracks there, by means of a soldering connection. For more stable fixing, an additional adhesive-bonding connection between capacitor 4 and printed circuit board 15 is illustrated here and generally known.

Despite this additional adhesive-bonding connection, the fixing of the heavy component proves to be insufficient for vibrations that occur, for example in vehicles, wherein the vibrations damage the electrically conductive connection between the heavy component and the conductor tracks of the printed circuit board. This is caused by the fact that here the heavy connection partner is bonded to the light connection partner and the soldering connection is therefore subjected to correspondingly severe loading on account of the mass inertia.

SUMMARY OF THE INVENTION

It is an object of the invention to provide a combination of a main carrier and a circuit board wherein a permanently secure electrically conductive connection of heavy components to the printed circuit board is formed and maintained even under heavy mechanical loads, such as vibrations.

The inventive combination comprises a main carrier and a printed circuit board with light and heavy electrical and/or electronic components fixed thereon, as is preferably used in vehicles with electrical auxiliary or main drives. In this case, according to the invention, at least one heavy component is mechanically fixedly connected to the main carrier, wherein all known connection techniques that form force-locking, positively locking or cohesive connections are suitable for the connections. In this case, it is advantageous if the heavy component has a higher mass than the first section of the printed circuit board.

Furthermore, the heavy component is electrically conductively connected to conductor tracks of a first section of the printed circuit board, wherein the first section is electrically conductively connected to a second section of the printed circuit board. A decoupling device is provided between the first and the second sections of the printed circuit board. The decoupling device decouples the two sections of the printed circuit board with respect to mechanical vibrations, such that the two sections, upon vibration being introduced into the combination, within the limits given by the decoupling device, may vibrate independently of one another, with different amplitudes, frequencies and vibration directions.

Particularly preferred developments of this circuit arrangement are mentioned in the respective description of the exemplary embodiments.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

FIG. 5 shows a detail of a prior art combination of a main carrier and a printed circuit board.

DETAILED DESCRIPTION OF THE PRESENTLY PREFERRED EMBODIMENTS

Figure 1:
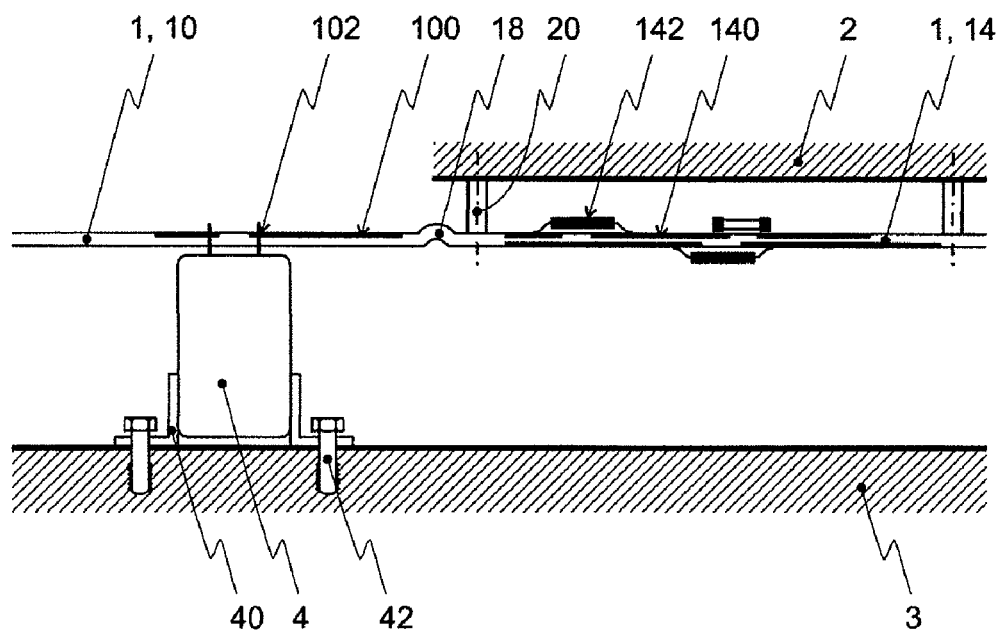
FIG. 1 is a detail of a first configuration of the combination according to the invention.

FIG. 1 is a detail of a first configuration of the inventive combination. Here the illustration shows a printed circuit board 1 constructed from first and second sections 10, 14, respectively. A heavy component 4, here a capacitor, is soldered to conductor tracks 100 of first section 10 of printed circuit board 1. Furthermore, capacitor 4 has a device 40 for screw connection and is connected to main carrier 3 in a force-locking manner by means of device 40 and two fixing screws 42. The connection between capacitor 4 and main carrier 3 is rigid, and couples capacitor 4 to main carrier 3 with respect to vibration. Consequently, vibrations that occur in the entire combination load primarily the rigid, that is to say mechanically robust, connection between capacitor 4, the heavy component, and main carrier 3, wherein this connection is embodied particularly stably compared to a soldering connection. In addition, the connection of capacitor 4, by means of its contact elements 102 to conductor tracks 100 is loaded here since first section 10 is likewise excited by the vibration acting from outside. However, this loading is significantly smaller compared with the loading according to the prior art, since here the lighter connection partner, first section 10 of the printed circuit board 1 is bonded to the heavy connection partner 4, the capacitor.

Exclusively further light components 142 are arranged on a second section 14 of printed circuit board 1, on conductor tracks 140 there, likewise by soldering. Components 142 illustrated by way of example are here integrated circuits in DIP housings and an SMD resistor.

Second section 14 of printed circuit board 1 is connected to an auxiliary carrier 2 by known connecting devices 20. Known connecting devices 20 are here once again screw connections with a respective spacing sleeve. Auxiliary carrier 2 may be, for example the cover of a housing such as mentioned above. The connection of main carrier 3 and auxiliary carrier 2 can be rigid or, advantageously, movable with respect to one another within limits, wherein the amplitude of this mobility should be smaller than that of first 10 and second 14 sections of printed circuit board 1 with respect to one another.

Abovementioned vibrations of the entire combination here primarily load the connection between second section 14 of printed circuit board 1 and auxiliary carrier 2. In the case of this loading, the influence of light components 142 is negligible by virtue of their small mass, and smaller mass inertia associated therewith, whereby the loading on their own fixing on printed circuit board 1 is small and, consequently, their secure electrical connection to conductor tracks 140 is ensured.

According to the invention, sections 10, 14 of printed circuit board 1 are connected by a decoupling device 18. Decoupling device 18 is embodied here as a flexible section of printed circuit board 1 and has conductor tracks that bridge decoupling device 18, for the electrically conductive connection of first and second sections 10, 14, respectively. By means of decoupling device 18, first section 10 is largely decoupled from the second section 14 of the printed circuit board 1 from the standpoint of vibration, regardless of whether the vibration is parallel or perpendicular to the plane of the printed circuit board.

The decoupling therefore separates first section 10 from second section 14 of printed circuit board 1 from the standpoint of vibration, whereby sections 10, 14 can vibrate independently of one another within the limits given by decoupling device 18. Consequently, vibrations of the entire combination load the soldering connection 102 of capacitor 4 and of printed circuit board 1 to a smaller extent than has heretofore been achieved. This is achieved since bodies higher in mass—here capacitor 4—are fixedly connected to main carrier 3, while first section 10—lower in mass in comparison with the capacitor—of printed circuit board 1 can vibrate relatively freely.

Figure 2:
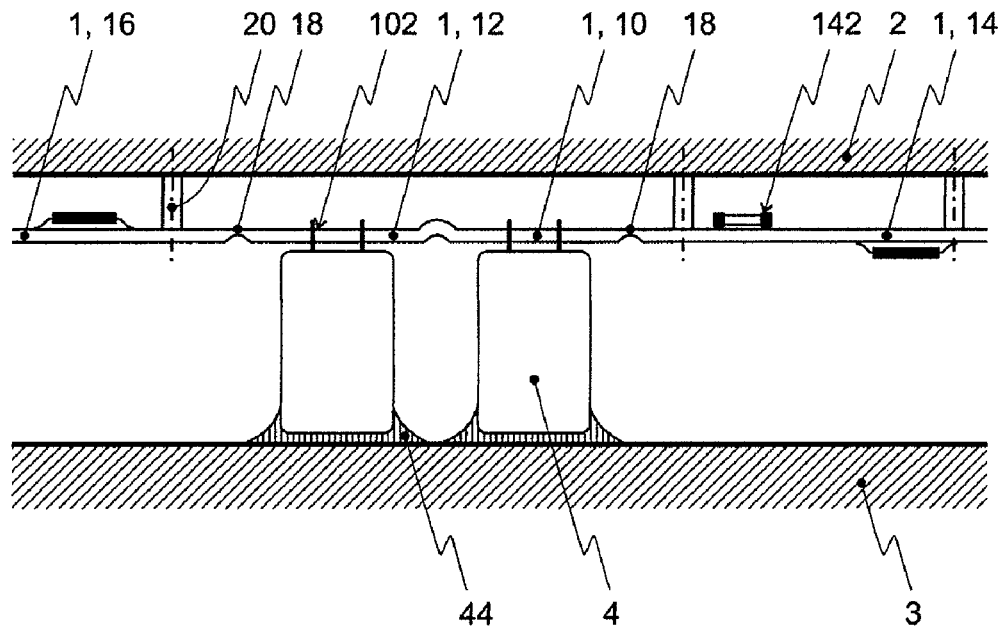
FIG. 2 is a detail of a second configuration of the combination according to the invention.

FIG. 2 shows a second configuration of the combination according to the invention. Identical objects are provided with identical reference symbols as also hereinafter, where here and hereinafter the illustration of conductor tracks 100, 140, cf. FIG. 1, is omitted for clarity. FIG. 2 once again shows a printed circuit board 1, although here with two second sections 14, 16, with a first section 10, 12 arranged in between, first section 10, 12 for its part again being subdivided.

First section 10, 12 having two partial sections that are likewise decoupled from one another, or conductor tracks arranged here, has electrically conductive connections to capacitors 4. This embodiment of first section 10, 12 may be preferred. It may likewise be preferred to arrange a plurality of heavy components 4 closely adjacent on a first section without partial sections that are decoupled from one another. This combination of capacitors 4 is formed by means of a soldering connection as described, but not restricted thereto. Capacitors 4 themselves are once again connected rigidly to a main carrier 3, although here cohesively by means of an adhesive-bonding connection 44.

Second sections 14, 16 with light components 142 arranged thereon are connected to an auxiliary carrier 2 by known connecting devices 20. Consequently, by means of decoupling device 18, here embodied by way of example as a recess in the region of the basic material of the printed circuit board 1 the two second sections 14, 16 of printed circuit board 1 are decoupled from first section 10, 12 from the standpoint of vibration.

Figure 3:
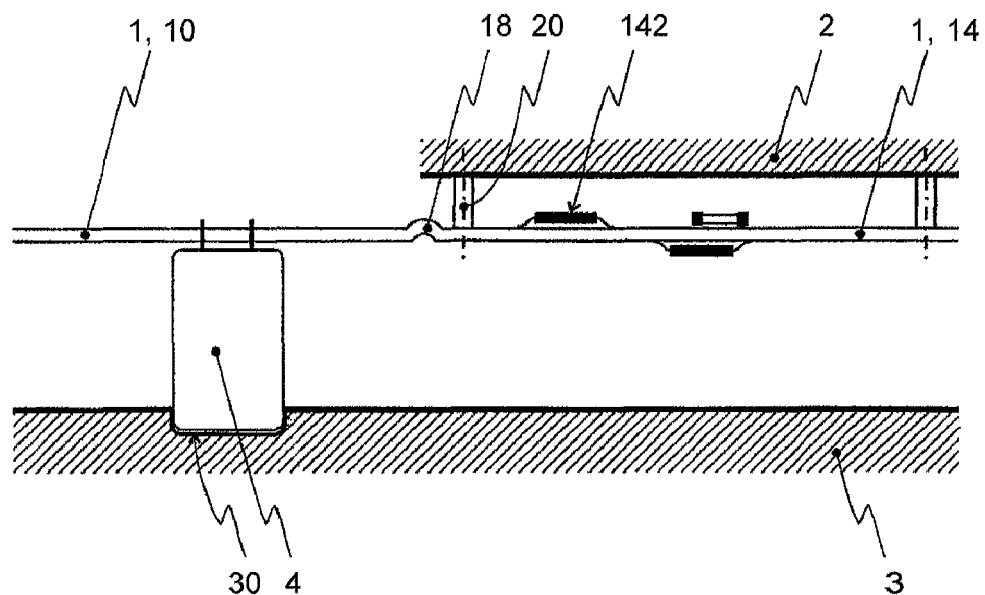
FIG. 3 is a detail of a third configuration of the combination according to the invention.

FIG. 3 is a detail of a third configuration of the inventive combination. The latter differs from that in accordance with FIG. 1 in that capacitor 4 is press-fit into a cutout 30 in the main carrier 3 and therefore enters into a positively locking connection therewith.

Figure 4:
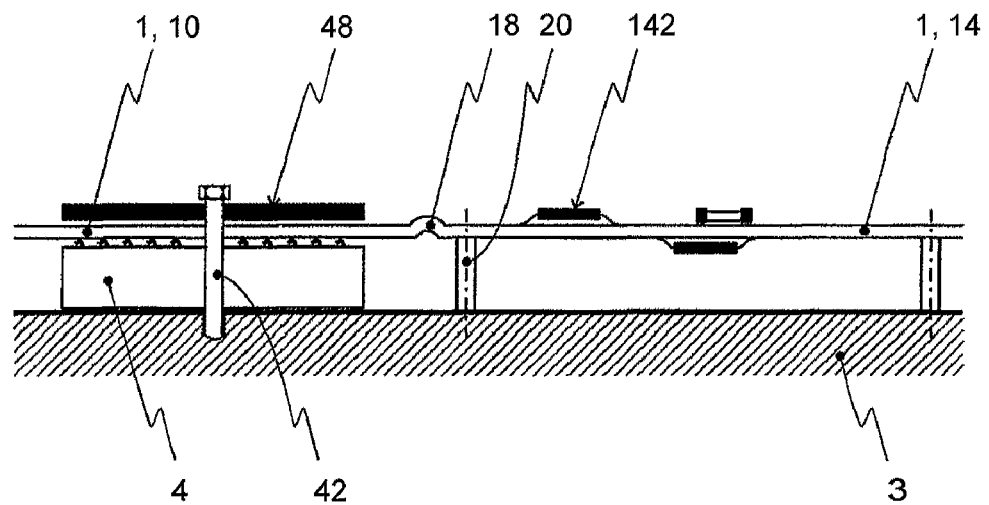
FIG. 4 is a detail of a fourth configuration of the combination according to the invention.

FIG. 4 is a detail of a fourth configuration of the inventive combination. This configuration differs from that of FIG. 1 in that the heavy component 4 here is a power semiconductor module in accordance with the prior art. Power semiconductor module 4 has a cutout for screw connection 42 to main carrier 3 and has contact springs for connection to the conductor tracks of first section 10 of the printed circuit board 1, wherein the connection is formed by means of a pressure member 48 and screw connection 42.

Furthermore, this configuration differs to the effect that the second section 14 of the printed circuit board 1 is not connected to an auxiliary carrier but rather to the main carrier 3 by means of known connecting devices 20.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements which perform substantially the same function in substantially the same way to achieve the same results are within the scope of the invention. Moreover, it should be recognized that structures and/or elements steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:
1. A combination comprising:
a main carrier; and
a printed circuit board having:
first and second substantially co-planar sections, said first and second sections being electrically conduc- tively connected to one another and being decoupled from one another with respect external to mechanical vibrations;

a decoupling device for permitting said first and second sections to be decoupled with respect to said mechanical vibrations;

conductor tracks on said first section; and at least one heavy component, said at least one heavy component being:
fixed to said first section of said printed circuit board,
mechanically fixedly connected to said main carrier, and
electrically conductively connected to said conductor tracks.

2. The combination of claim 1, wherein said at least one heavy component is force-lockingly connected to said main carrier.

3. The combination of claim 1, wherein said at least one heavy component is positively locked to said main carrier.

4. The combination of claim 1, wherein said at least one heavy component is cohesively connected to said main carrier.

5. The combination of claim 1, wherein said decoupling device is formed as a flexible section of said printed circuit board.

6. The combination of claim 1, wherein said decoupling device is formed as a recess in said printed circuit board.

7. The combination of claim 1, wherein said at least one heavy component is selected from the group consisting of a capacitor, a transformer and a power semiconductor module.

8. The combination of claim 1, further comprising an auxiliary carrier fixedly connected to said second section of said printed circuit board and mechanically connected to said main carrier.

9. The combination of claim 8, wherein said main carrier and said auxiliary carrier are connected movably with respect to one another.

10. The combination of claim 1, wherein said combination further includes at least one light component affixed to said printed circuit board.

11. The combination of claim 10, wherein said at least one heavy component is more massive than said at least one light component by a factor of at least approximately one hundred.

12. The combination of claim 1, wherein said decoupling device is manufactured of a material having a thickness and flexibility so that said decoupling device is more flexible than said first and second sections of said circuit board.

* * * * *